May 7, 1968 S. FELDMAN 3,382,371

ELECTRONIC LATCHING SWITCH

Filed Feb. 1, 1965

INVENTOR.
Stanley Feldman

BY Mueller & Aichele

ATT'YS.

United States Patent Office
3,382,371
Patented May 7, 1968

3,382,371
ELECTRONIC LATCHING SWITCH
Stanley Feldman, Evanston, Ill., assignor to Motorola, Inc., Franklin Park, Ill., a corporation of Illinois
Filed Feb. 1, 1965, Ser. No. 429,273
5 Claims. (Cl. 307—38)

ABSTRACT OF THE DISCLOSURE

This electronic latching switch includes a plurality of four layer diodes each of which is connected between a power supply and a load. A plurality of momentary push-button switches, each of which is associated with a respective four layer diode, may be selectively engaged to initially couple a control potential through an RC time base circuit to the cathodes of all of the four layer diodes to render them non-conducting. The four layer diode associated with the momentary pushbutton switch that has been engaged will then be energized through the pushbutton switch by the charging up of the capacitor in the RC time circuit, which removes the control potential from the cathodes of the four layer diodes.

This invention pertains to a switching circuit and more particularly to an electronic latching switch for selectively coupling a power source to a plurality of loads.

It is frequently desirable to be able to switch a DC voltage to one of any number of circuits. One example where such a switch is used is in the alignment of tuned circuits in an AM radio. In such a system the latching switch selectively applies a DC voltage to one of a plurality of oscillators biasing the oscillator into conduction at a known frequency to provide a reference signal to accurately align the tuning circuits of the radio.

Present mechanical latching switches generally require a considerable amount of space and may be of complex construction. Although they can be readily assembled in straight lines, such switches are severely limited in being adapted to any other configuration which might be necessary because of space limitations or design features. As in any mechanical device, they are more subject to wear than are similar electronic designs thereby resulting in more frequent failure and reduced reliability.

It is, therefore, an object of this invention to provide an improved electronic latching switch for selectively coupling a power source to a plurality of loads.

It is another object of this invention to provide a highly versatile electronic latching switch that can be assembled into any geometrical configuration that may be required.

It is still another object of this invention to provide an electronic latching switch that is smaller in size and more reliable than prior designs.

One feature of this invention is the provision, in an electronic latching switch, of a plurality of potential controlled bistable switches selectively connected between a power source and associated loads, and a control circuit for automatically opening any conducting potential controlled switch immediately followed by the closing of a selected one of such switches.

Another feature of this invention is the provision in an electronic latching switch, of a resistance-capacitance network having a time constant for coupling a control potential received through the momentary switches to the output electrode of the potential control switches to cut off conduction thereof.

Still another feature of the invention is the provision, in an electronic latching device, of a plurality of isolation diodes coupling momentary switches to the resistance-capacitance network thereby isolating the input electrodes of the potential control switches from the control potential except that input electrode common to the circuit of the momentary switch which is closed.

In practicing this invention an electronic latching switch is used to couple a power source to a plurality of loads. The combination includes a plurality of potential controlled bistable switches (such as Shockley diodes) selectively connected between the power source and the loads. There is a source of control potential and a plurality of momentary switches. Means for coupling the power source to the loads include a connection of the control potential through each of the momentary switches to the input electrode of an associated potential controlled switch, thereby forward biasing the switch into conduction. Further means for uncoupling the power source from the load include a connection of the control potential through all of the momentary switches to the output electrode of the potential control switches for back biasing thereof.

A potential delaying reactance consisting of a parallel resistance-capacitance network having a time constant couples the control potential through the momentary switches to the output electrode of the potential control switches to cutoff conduction thereof as above described. As the capacitor is charged at a rate determined by the time constant of the network, the control potential coupled through the selected momentary switch to the input electrode of the selected potential control switch forward biases that switch into conduction.

Figure 1:
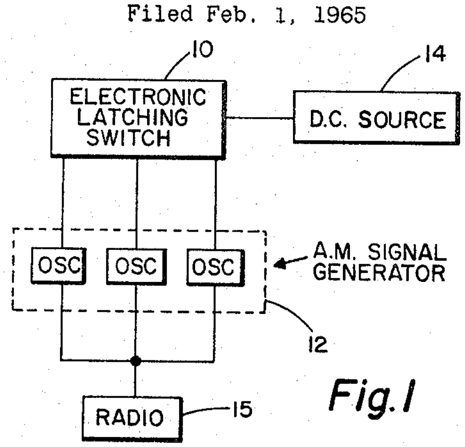
FIG. 1 is a block diagram illustrating one embodiment of the invention.

Referring now to FIG. 1, which shows a practical embodiment of the invention, the electronic latching switch 10 is coupled to a plurality of oscillators that form an AM signal generator 12. The potential from DC source 14 is selectively coupled by means of latching switch 10 to the various oscillators of the signal generator 12. This direct current potential biases the selected oscillator into conduction at a known frequency to provide a reference signal at the radio receiver 15. As those who are familiar with the art know, it is a common practice to use a reference signal from a signal generator to align superheterodyne receivers by finally adjusting the tuned circuits to the reference signal in order to make each circuit resonant at the proper dial position.

Figure 2:
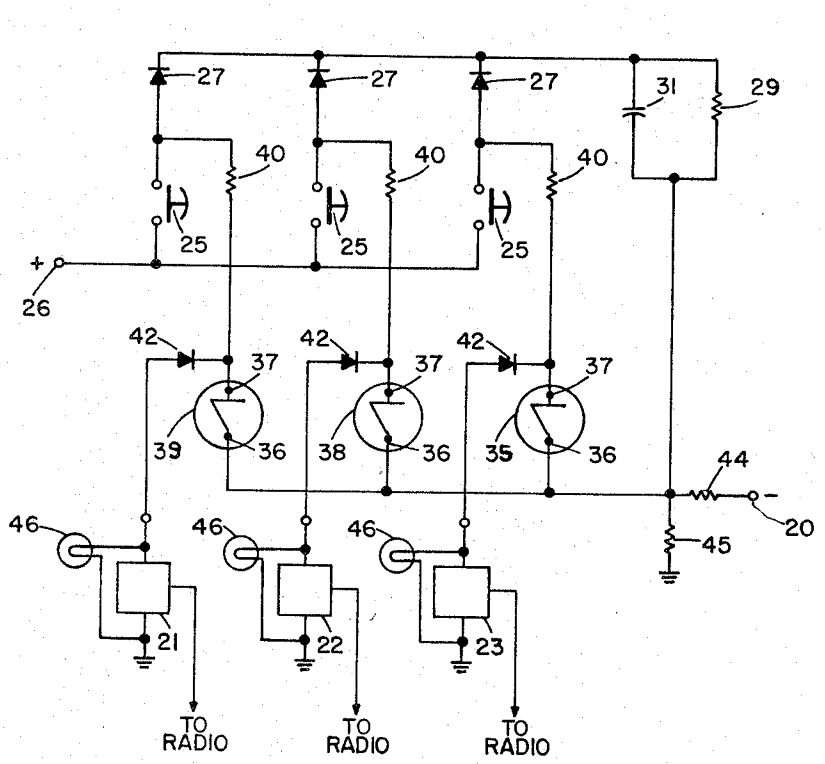
FIG. 2 is a schematic diagram showing the electronic latching switch circuit with oscillators as loads connected thereto.

The operation of the electronic latching switch 10 can be readily understood by refering to FIG. 2 which schematically represents the circuit of the latching switch indicating the means by which the power source 20 is selectively coupled to the oscillators 21, 22 and 23 representing typical loads for the switch.

Assume, for example, that oscillator 21 is coupled to power source 20, and it is desired to disconnect oscillator 21 from, and couple oscillator 23 to, the power source 20. To accomplish this, momentary pushbutton switch 25 associated with Shockley diode 35 is engaged to connect a control potential, say of 20 volts, from the control potential source 26 through the momentary switch 25 and isolation diode 27 to the parallel resistance-capacitance network represented by resistor 29 and capacitor 31. The network time constant is determined by the respective values of components 29 and 31. Instantaneously, since capacitor 31 will initially resist any change of potential in it, the control potential is coupled through the parallel resistance-capacitance network to all of the output electrodes represented at 36 of the potential controlled bistable switches or Shockley diodes 35, 38 and 39.

A Shockley diode as particularly used in this invention breaks down and conducts when a voltage on the diode reaches a certain limit. They remain in conduction until either voltage of opposite polarity is placed on them, or the current through them is reduced to a predetermined amount.

The potential at the output electrode 36, when diode 39 is conducting is lower than the potential on input electrode 37 of diode 39 and the 20 volt control potential placed at the output electrode 36 by engaging the momentary switch 25. When switch 25 is engaged, the potential at the output electrode 36 increases over that on the input electrode 37. When this occurs, the Shockley diode 39 associated in the circuit with oscillator 21 is effectively back biased non-conducting thereby disconnecting oscillator 21 from the power source 20.

In a like manner, the engagement of switch 25 conducts a control potential through the switch 25 and resistor 40 to the input electrode represented at 37 of the Shockley diode 35 associated with the engaged switch 25. The isolation diodes 27 prevent the control potential from being applied to the input electrode 37 of either Shockley diode 38 or 39.

Therefore, at this point in time there is a control potential on the output electrode 36 of Shockley diodes 35, 38 and 39 back biasing diodes 39 non-conducting, and the same control potential is being coupled by resistor 40 to the input electrode 37 of Shockley diode 35. As the charge on capacitor 31 increases at a rate determined by the time constant of the parallel resistance-capacitance network, the potential at the output electrode 36 of diode 35 is reduced to a value less than the control potential on the input electrode 37 of that diode until the potential controlled switch 35 is forward biased into conduction. The charge on the capacitor 31 is discharged through resistor 29 and the switch 10 is ready for the next operation.

The current path when oscillator 23 is biased on is from the power source 20 through the oscillator 23, isolating diode 42, Shockley diode 35 and resistor 44, which coupled with resistor 45 forms a voltage divider to discharge the current back to the power source 20 thereby completing the circuit. Current also flows through indicator lamp 46 to indicate which load is energized and is then discharged through the voltage divider, back to the power supply 20. The value of resistor 45 limits the current flow through the lamp 46 to an amount that cannot light the lamp 46 unless said lamp's associated Shockley diode is conducting.

The isolating diodes 42 protect the loads as represented by oscillators 21, 22 and 23 from overloading by not permitting the control potential placed on input electrode 37 during the switching operation to be coupled to the loads.

Although the operation of the electronic latching switch 10 has been explained using three switching circuits, it should be understood that the number of switching circuits is optional, varying with the number of loads that are to be connected to the power supply.

It may, therefore, be seen that the invention comprises an improved construction for an electronic latching switch. The construction provides for a latching switch that can be assembled into any geometrical configuration that is required, yet being smaller in size and more reliable than its mechanical counterpart.

I claim:

1. An electronic latching switch to couple a power source to a plurality of loads, including in combination, a plurality of potential controlled switches having a bistable characteristic and requiring application of a potential thereto for rendering the same non-conductive, means for connecting each potential controlled switch to an associated load, means connecting said potential controlled switches to the power source, momentary switch means, a circuit connected between said momentary switch means and said potential controlled switches for simultaneously applying a potential thereto in response to actuation of said momentary switch means to render all said potential controlled switches non-conductive, and a further circuit individually connected from said momentary switch means to each potential controlled switch for selectively rendering the same conductive.

2. An electronic latching switch to couple a power source to a plurality of loads, including in combination, a plurality of potential controlled switches having input and output electrodes, means for individually connecting said potential controlled switches between the power source and each load, a source of control potential, a momentary switch associated with each potential controlled switch and a resistance-capacitance network having a time constant, a connection from said source of control potential to one terminal of each momentary switch, a connection from the other terminal of each momentary switch to one electrode of each potential controlled switch and to said resistance-capacitance network and a connection from said resistance-capacitance network to another electrode of each potential controlled switch, so that engagement of one momentary switch causes cutoff of any conducting potential controlled switch and conduction of the potential controlled switch associated with the engaged momentary switch.

3. An electronic latching switch to couple a power source to a plurality of loads, including in combination, a plurality of Shockley diodes having input and output electrodes, means individually connecting each Shockley diode between the power source and a load, a source of control potential, a momentary switch associated with each Shockley diode, a resistance-capacitance network having a time constant, a plurality of isolation diodes, a connection from said source of control potential to one terminal of each momentary switch, a connection from the other terminal of each momentary switch to said input electrode of each Shockley diode and a connection from the same terminal through an isolation diode to said resistance-capacitance network and a connection from said resistance-capacitance network to said output electrode of each Shockley diode, so that engagement of one momentary switch couples said control potential through said isolation diode and said resistance-capacitance network associated with said engaged momentary switch to said output electrodes of said Shockley diode to back bias any conducting Shockley diode to cutoff and connects said control potential to said input electrode of said Shockley diode associated with said engaged momentary switch to forward bias said associated Shockley diode into conduction thereby connecting the power source to the load, said isolation diodes preventing said control potential from being coupled to the input electrode of any other Shockley diode.

4. A switching circuit to couple a power source to a plurality of loads including in combination, a plurality of potential controlled switches having first and second electrodes and means for individually connecting the same between the power source and the loads, a source of control potential and a plurality of pushbutton momentary switches, means for conductively coupling the power source selectively to the loads including a connection of said control potential through each of said momentary switches to the first electrode of an associated potential controlled switch for causing conduction thereof, and means for uncoupling the power source from the loads including time base means connecting said control potential through each of said momentary switches to the second electrode of said potential controlled switches for causing cutoff thereof, so that upon engaging a momentary switch associated with a potential controlled switch that is not conducting all the potential controlled switches will be cut off and said non-conducting associated potential controlled switch will be rendered conducting.

5. An electronic latching switch to couple a power source to a plurality of loads including in combination, a plurality of Shockley diodes having input and output electrodes and means for individually connecting the same between the power source and the loads, a source of control potential and a plurality of manually operated pushbutton momentary switches, means for coupling the power source selectively to a load including a connection of said control potential through each of said momentary pushbutton switches to an input electrode of an associated one of said Shockley diodes for forward biasing said diode into conduction by selectively engaging one of said momentary switches thereby coupling said control potential through said momentary switch to the input electrode of said associated Shockley diode, and means for uncoupling the power source from the loads including a parallel connected resistance-capacitance network having a time constant connecting said control potential through each of said momentary pushbutton switches to the output electrodes of all of said Shockley diodes thereby momentarily back biasing said Shockley diodes into non-conducting condition upon engagement of a momentary switch that is associated with a Shockley diode that is not conducting.

References Cited

UNITED STATES PATENTS

| | | | |
|---|---|---|---|
| 3,099,962 | 8/1963 | Smith | 307—80.5 |
| 3,168,657 | 2/1965 | Wells | 307—88.5 |
| 3,191,060 | 6/1965 | Mahoney | 307—88.5 |
| 3,229,191 | 1/1966 | Williamson | 307—41 X |

ORIS L. RADER, *Primary Examiner.*

T. J. MADDEN, T. B. JOIKE, *Assistant Examiners.*